(12) United States Patent
Takamori

(10) Patent No.: US 10,962,612 B2
(45) Date of Patent: Mar. 30, 2021

(54) MAGNETIC RESONANCE IMAGING APPARATUS HAVING HIGH FREQUENCY COIL ISOLATED FROM GRADIENT COILS AND A TAPERED / INCLINED COIL SUPPORT UNIT

(71) Applicant: TOSHIBA MEDICAL SYSTEMS CORPORATION, Otawara-shi (JP)

(72) Inventor: Hiromitsu Takamori, Otawara Tochigi (JP)

(73) Assignee: Toshiba Medical Systems Corporation, Tochigi (JP)

(*) Notice: Subject to any disclaimer, the term of this patent is extended or adjusted under 35 U.S.C. 154(b) by 564 days.

(21) Appl. No.: 14/565,997

(22) Filed: Dec. 10, 2014

(65) Prior Publication Data

US 2015/0192650 A1 Jul. 9, 2015

(30) Foreign Application Priority Data

Jan. 9, 2014 (JP) .................................. 2014-002695

(51) Int. Cl.
*G01R 33/3415* (2006.01)
*G01R 33/34* (2006.01)
(Continued)

(52) U.S. Cl.
CPC . *G01R 33/34007* (2013.01); *G01R 33/34046* (2013.01); *G01R 33/3854* (2013.01); *G01R 33/3858* (2013.01); *G01R 33/3802* (2013.01)

(58) Field of Classification Search
CPC ............ G01R 33/3802; G01R 33/3858; G01R 33/34007; G01R 33/34046
(Continued)

(56) References Cited

U.S. PATENT DOCUMENTS 4,926,125 A * 5/1990 Roemer ............... G01R 33/385
324/318
5,332,972 A * 7/1994 Takenouchi ......... G01R 33/385
324/318

(Continued)

FOREIGN PATENT DOCUMENTS

JP H02-121632 A 5/1990
JP H03-103233 A 4/1991

(Continued)

OTHER PUBLICATIONS

English translation of JP2006-282860 provided by Espacenet. (Year: 2020).*

(Continued)

*Primary Examiner* — Rishi R Patel
(74) *Attorney, Agent, or Firm* — Nixon & Vanderhye, P.C.

(57) ABSTRACT

A magnetic resonance imaging apparatus includes a high-frequency coil and a coil supporting unit. The high frequency coil is disposed inside a gradient coil and that generates a high-frequency magnetic field in a static magnetic field. The coil supporting unit is formed with a substantially cylindrical shape and that supports the high-frequency coil. The coil supporting unit has a certain range including a magnetic field center and formed in parallel with an axial direction. Both ends of the coil supporting unit each have an internal circumference greater than the internal circumference of the certain range.

11 Claims, 8 Drawing Sheets

(51) Int. Cl.
*G01R 33/385* (2006.01)
*G01R 33/36* (2006.01)
*G01R 33/38* (2006.01)

(58) Field of Classification Search
USPC .................. 324/300–322; 600/407–435; 381/128–131
See application file for complete search history.

(56) References Cited

U.S. PATENT DOCUMENTS

| | | | | |
|---|---|---|---|---|
| 5,485,087 A * | 1/1996 | Morich | ............... | G01R 33/385 324/318 |
| 5,497,089 A * | 3/1996 | Lampman | ............ | G01R 33/385 324/318 |
| 5,530,355 A * | 6/1996 | Doty | .................... | G01R 33/385 324/318 |
| 6,054,854 A * | 4/2000 | Kawamoto | ......... | G01R 33/381 324/318 |
| 6,350,204 B1 * | 2/2002 | Yasui | ................... | B29C 53/587 464/181 |
| 6,720,768 B2 * | 4/2004 | Crozier | ........... | G01R 33/34046 324/309 |
| 7,498,810 B2 * | 3/2009 | Lvovsky | .............. | G01R 33/381 324/318 |
| 8,890,529 B2 * | 11/2014 | Jiang | ................... | G01R 33/385 324/318 |
| 9,435,869 B2 * | 9/2016 | Konijn | ............. | G01R 33/56572 |
| 9,817,096 B2 * | 11/2017 | Freytag | ............. | G01R 33/4215 |
| 2006/0055406 A1 * | 3/2006 | Lvovsky | ............. | G01R 33/381 324/318 |
| 2011/0227573 A1 * | 9/2011 | Konijn | ................. | G01R 33/385 324/318 |
| 2012/0306495 A1 * | 12/2012 | Jiang | .................... | G01R 33/385 324/318 |
| 2014/0163664 A1 * | 6/2014 | Goldsmith | ....... | A61B 17/00491 623/1.11 |
| 2014/0285201 A1 * | 9/2014 | Freytag | ............. | G01R 33/4215 324/322 |
| 2015/0192650 A1 * | 7/2015 | Takamori | ......... | G01R 33/34007 324/322 |
| 2015/0346297 A1 * | 12/2015 | Naka | .................. | G01R 33/3858 324/322 |

FOREIGN PATENT DOCUMENTS

| | | |
|---|---|---|
| JP | H05-051306 U | 7/1993 |
| JP | 2000-318053 A | 11/2000 |
| JP | 2006-282860 A | 10/2006 |
| JP | 2008-520265 A | 6/2008 |
| JP | 2011-87904 | 5/2011 |
| JP | 2013-39152 | 2/2013 |
| WO | 2006/054187 A1 | 5/2006 |

OTHER PUBLICATIONS

Japanese office action dated Oct. 17, 2017, in Patent Application No. JP 2014-002695.
Japanese office action dated Jul. 2, 2019, in Patent Application No. JP 2018-127336.
JP Office Action dated Jan. 21, 2020 in JP 2018-127336.

* cited by examiner

MAGNETIC RESONANCE IMAGING APPARATUS HAVING HIGH FREQUENCY COIL ISOLATED FROM GRADIENT COILS AND A TAPERED / INCLINED COIL SUPPORT UNIT

CROSS-REFERENCE TO RELATED APPLICATIONS

This application is based upon and claims the benefit of priority from Japanese Patent Application No. 2014-002695, filed on Jan. 9, 2014, the entire contents of all of which are incorporated herein by reference.

FIELD

Embodiments described herein relate generally to a magnetic resonance imaging apparatus.

BACKGROUND

When an MRI image is imaged by a magnetic resonance imaging (MRI) apparatus, a subject in a state of being placed on a couchtop is moved into a bore included in a gantry device. The gantry device generates a high-frequency magnetic field and a gradient magnetic field based on a pulse sequence in accordance with imaging conditions, thereby collecting a magnetic resonance signal generated from the subject.

The gantry device includes a static magnetic field magnet that generates a uniform static magnetic field in the bore, and a gradient coil that is disposed inside the static magnetic field magnet and generates a gradient magnetic field in the bore. The static magnetic field magnet, the gradient coil, and other components are arranged outside a bore tube for securing the bore. A rail for running the couchtop, for example, is disposed in the bore of the gantry device.

In recent years, large-diameter MRI apparatuses have been developed with the bore space made as physically large as possible, to improve comfortableness for the subject in imaging. However, there is a limit to an increase in the diameter of the bore from the viewpoints of performance of RF coils and image quality of MRI images.

DETAILED DESCRIPTION

A magnetic resonance imaging apparatus according to an embodiment includes a high-frequency coil and a coil supporting unit. The high-frequency coil is disposed inside a gradient coil and that generates a high-frequency magnetic field in a static magnetic field. The coil supporting unit is formed with a substantially cylindrical shape and that supports the high-frequency coil. The coil supporting unit has a certain range including a magnetic field center and formed in parallel with the axial direction of the coil supporting unit. Both ends of the coil supporting unit each have an internal circumference greater than the internal circumference of the certain range.

The magnetic resonance imaging apparatus according to the embodiment will be described hereinafter with reference to several drawings.

First Embodiment

Figure 1:
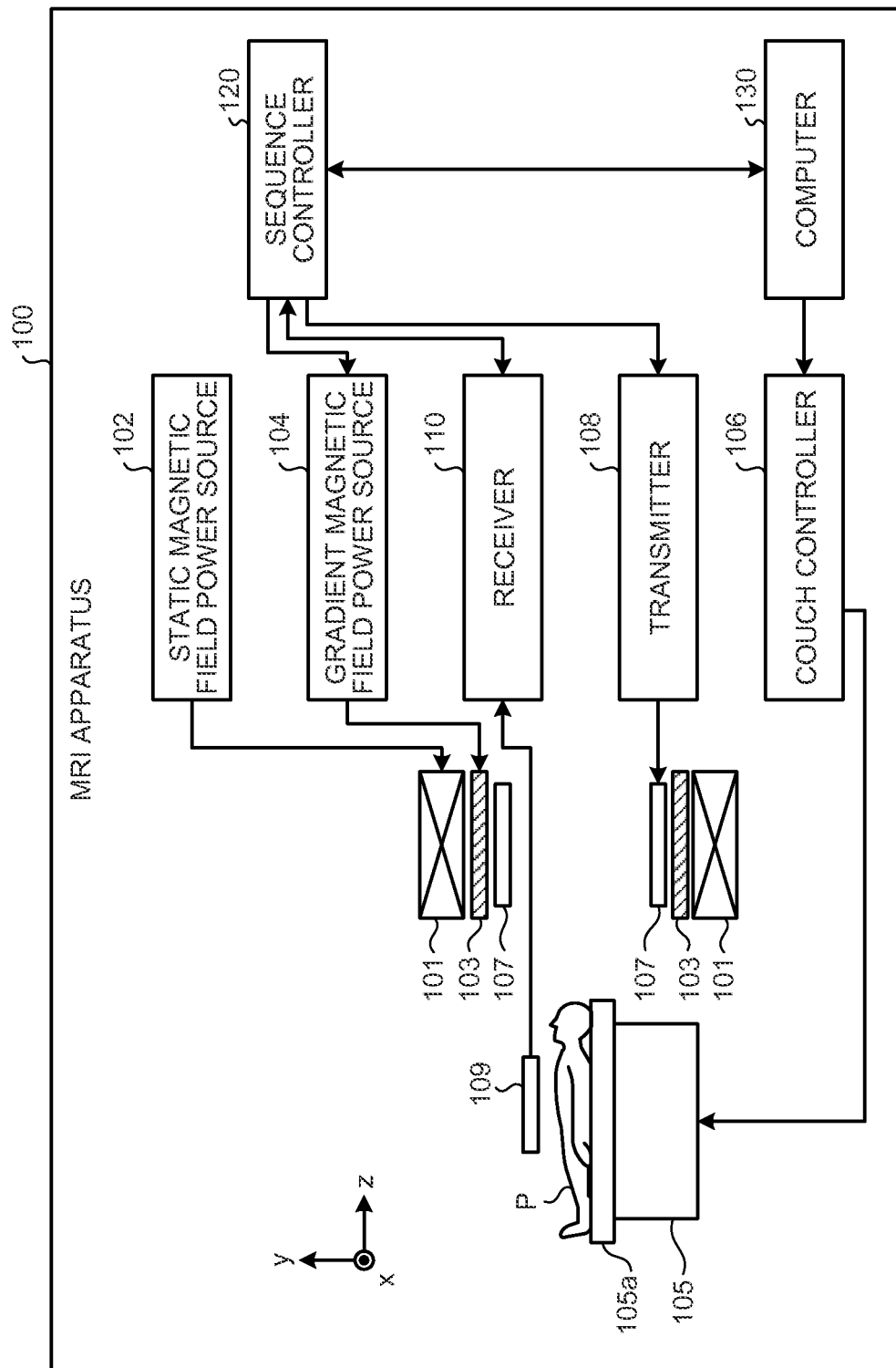
FIG. 1 is a functional block diagram illustrating a configuration of an MRI apparatus according to a first embodiment.

FIG. 1 is a functional block diagram illustrating a configuration of an MRI apparatus 100 according to a first embodiment. A magnetic resonance imaging apparatus will be referred to as the MRI (Magnetic Resonance Imaging) device hereinafter.

As illustrated in FIG. 1, the MRI apparatus 100 includes a static magnetic field magnet 101, a static magnetic field power source 102, a gradient coil 103, a gradient magnetic field power source 104, a couch 105, a couch controller 106, a whole body (WB) coil 107, a transmitter 108, a reception coil 109, a receiver 110, a sequence controller 120, and a computer 130. The MRI apparatus 100 does not include a subject P (such as a human body). In addition, the configuration illustrated in FIG. 1 is a mere example.

The static magnetic field magnet 101 is a hollow magnet having a substantially cylindrical shape, and generates a static magnetic field in the inside space thereof. For example, the static magnetic field magnet 101 is a superconductive magnet, and excited with an electric current supplied from the static magnetic field power source 102. The static magnetic field power source 102 supplies an electric current to the static magnetic field magnet 101. The static magnetic field magnet 101 may be a permanent magnet, and in such a case the MRI apparatus 100 may not include the static magnetic field power source 102. The static magnetic field power source 102 may be provided separately from the MRI apparatus 100.

The gradient coil 103 is a hollow coil having a substantially cylindrical shape, and disposed inside the static magnetic field magnet 101. The gradient coil 103 is formed of a combination of three coils that correspond to respective axes of x, y, and z that are orthogonal to each other. The three coils are individually supplied with an electric current from the gradient magnetic field power source 104, and each generate a gradient magnetic field having a magnetic field strength that varies along the respective axes of x, y, and z. The gradient magnetic fields along the respective axes x, y, and z generated by the gradient coil 103 are, for example, a slice encoding gradient magnetic field $G_{SE}$ (or a slice selection gradient magnetic field $G_{SS}$), a phase encoding gradient magnetic field $G_{PE}$, and a frequency encoding gradient magnetic field $G_{RO}$, respectively. The gradient magnetic field power source 104 supplies an electric current to the gradient coil 103.

The couch 105 includes a couchtop 105a on which a subject P is placed, and inserts the couchtop 105a in a state where the subject P is placed thereon into a hollow (imaging port) of the gradient coil 103, under the control of the couch controller 106. Generally, the couch 105 is installed such that the longitudinal direction thereof is parallel with the central axis of the static magnetic field magnet 101. The couch controller 106 drives the couch 105 to move the couchtop 105a in the longitudinal direction and the vertical direction, under the control of the computer 130.

The WB coil 107 is disposed inside the gradient coil 103, and supplied with RF pulses from the transmitter 108 to generate a high-frequency magnetic field. The WB coil 107 receives a magnetic resonance signal (hereinafter properly referred to as an "MR (Magnetic Resonance) signal") generated from the subject P by influence of the high-frequency magnetic field, and outputs the received MR signal to the receiver 110. The WB coil 107 is an example of an RF coil that is disposed inside the static magnetic field magnet 101.

The transmitter 108 supplies the WB coil 107 with RF pulses corresponding to a Larmor frequency that is determined based on the type of target atoms and a magnetic field strength.

The reception coil 109 is disposed inside the gradient coil 103, and receives an MR signal generated from the subject P by influence of the high-frequency magnetic field. When the reception coil 109 receives an MR signal, the reception coil 109 outputs the received MR signal to the receiver 110.

The WB coil 107 and the reception coil 109 described above are mere examples. For example, each of the WB coil 107 and the reception coil 109 may be formed of one of a coil having only a transmitting function, a coil having only a receiving function, and a coil having transmitting and receiving functions, or a combination of one or more of these.

The receiver 110 detects an MR signal that is output from the reception coil 109, and generates MR data based on the detected MR signal. Specifically, the receiver 110 generates MR data by converting the MR signal that is output from the reception coil 109 into digital data. The receiver 110 also transmits the generated MR data to the sequence controller 120. The receiver 110 may be provided on the gantry device that includes the static magnetic field magnet 101 and the gradient coil 103.

The sequence controller 120 drives the gradient magnetic field power source 104, the transmitter 108, and the receiver 110 based on sequence information transmitted from the computer 130, thereby imaging the subject P. The sequence information is information that defines a process for executing imaging. The sequence information defines the intensity of the electric current to be supplied to the gradient coil 103, timing at which the electric current is supplied, the intensity of RF pulses to be supplied from the transmitter 108 to the WB coil 107, timing at which the RF pulses are applied, and timing at which the receiver 110 detects an MR signal, for example. For example, the sequence controller 120 is an integrated circuit such as an application specific integrated circuit (ASIC) and a field programmable gate array (FPGA), or an electronic circuit such as a central processing unit (CPU) and a micro processing unit (MPU).

When the sequence controller 120 receives MR signal data from the receiver 110 as a result of controlling the gradient magnetic field power source 104, the transmitter 108, and the receiver 110 to image the subject P, the sequence controller 120 transmits the received MR signal data to the computer 130.

The computer 130 controls the whole MRI apparatus 100, and generates an MR image, for example. For example, the computer 130 causes the sequence controller 120 to execute an imaging sequence based on imaging conditions that are input by the operator. The computer 130 also reconstructs an image based on MR signal data transmitted from the sequence controller 120. The computer 130 stores the reconstructed image in a storage unit, and displays the reconstructed image on a display unit. For example, the computer 130 is an information processing device such as a computer.

The WB coil 107 is disposed in a proper position between the central axis and the gradient coil 103. For example, an RF shield is generally stuck on an internal circumferential surface of the gradient coil 103. The WB coil 107 is preferably disposed in a position apart from the gradient coil 103, because an RF power is reduced as the WB coil 107 is closer to the RF shield. However, as the position of the WB coil 107 is disposed more apart from the gradient coil 103, the space (bore) into which the subject is inserted is reduced, and comfortableness deteriorates. Thus, the WB coil 107 is disposed in a proper position from the viewpoint of maintaining the RF power with the size of the bore secured.

A coil supporting unit (bobbin) that supports the WB coil 107 is used to dispose the WB coil 107 in a proper position. For example, the WB coil 107 is set on an external circumferential surface of the coil supporting unit. The coil supporting unit is formed with an internal diameter (internal circumference) having an adjusted size such that the WB coil 107 is disposed in a proper position. The coil supporting unit is disposed inside the gradient coil 103.

Figure 2:
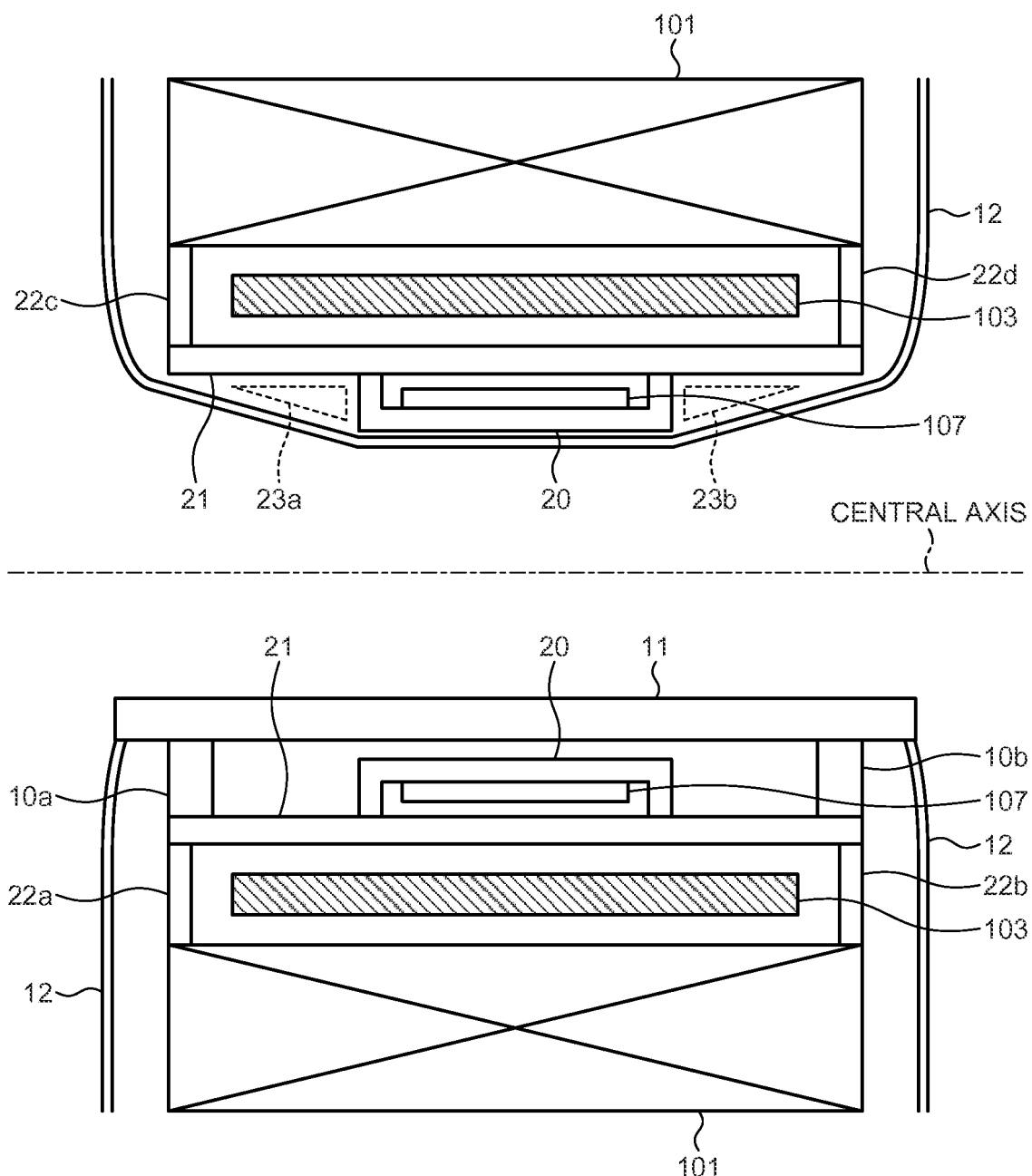
FIG. 2 is a diagram illustrating an example of a coil supporting unit.
Figure 3:
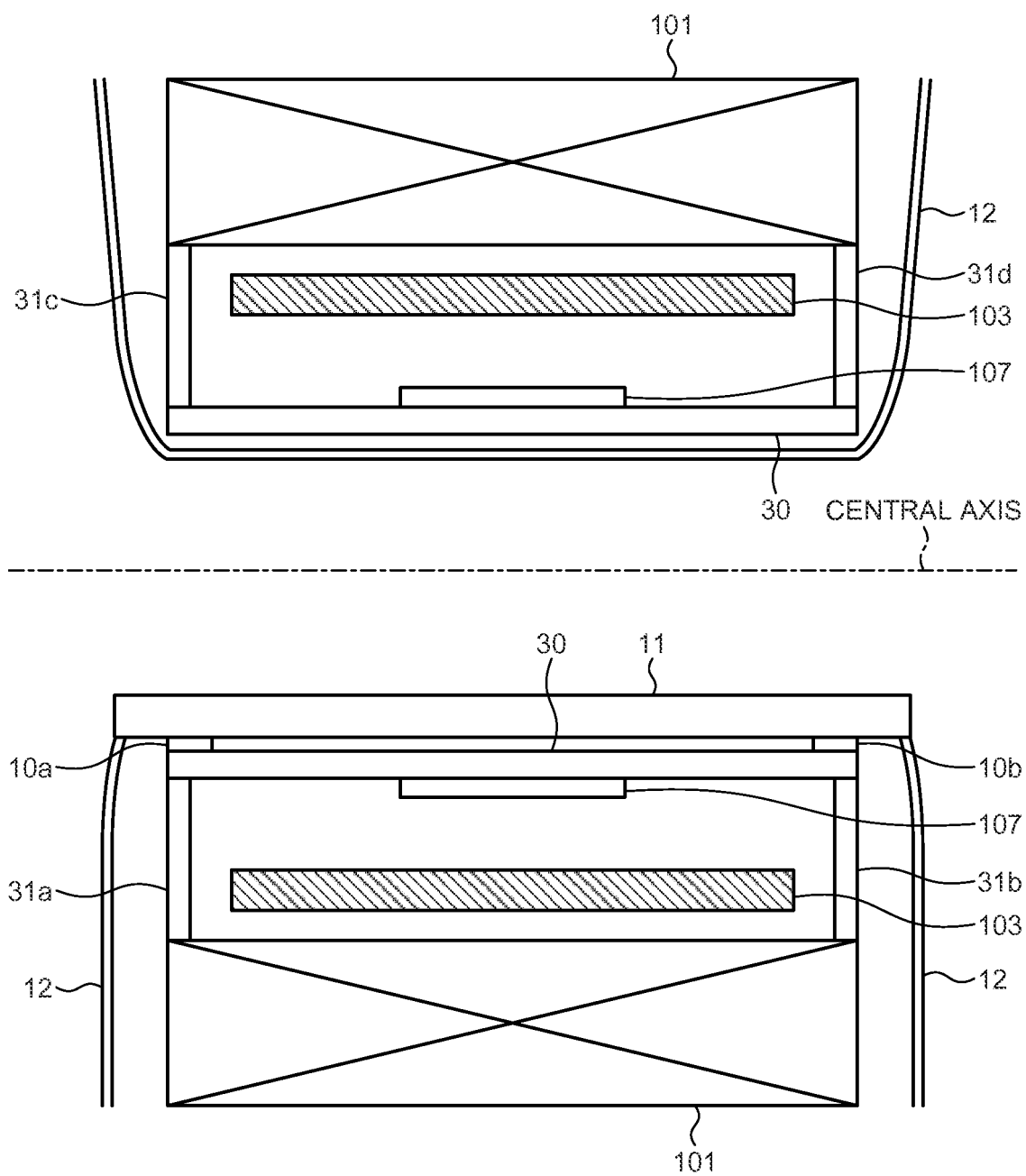
FIG. 3 is a diagram illustrating an example of the coil supporting unit.

FIG. 2 and FIG. 3 are diagrams illustrating examples of the coil supporting unit. Each of FIG. 2 and FIG. 3 is a cross-sectional view of a gantry in a yz plane that extends along the central axis of the static magnetic field magnet 101.

In the example illustrated in FIG. 2, a coil supporting unit 20 is formed to have a smaller length in the axial direction. Specifically, the axial length of the coil supporting unit 20 is set to the smallest length within a range in which the WB coil 107 can be disposed. The coil supporting unit 20 is supported by a cylindrical member 21 having a length that is substantially equal to that of the static magnetic field magnet 101. The cylindrical member 21 is supported by, for example, a plurality of support members 22a, 22b, 22c, and 22d. The WB coil 107 is thereby disposed in a proper position. A couch rail 11 is installed inside the cylindrical member 21 with, for example, support members 10a and 10b. The gantry is covered with a gantry cover 12 except for a surface covered with the couch rail 11. In addition, a sound insulating material or a sound absorbing material is disposed in spaces 23a and 23b between the gantry cover 12 and the cylindrical member 21.

In the example illustrated in FIG. 3, a coil supporting unit 30 has a length substantially equal to that of the static magnetic field magnet 101, and is disposed in parallel with the central axis. In addition, the coil supporting unit 30 is supported by, for example, a plurality of support members 31a, 31b, 31c, and 31d. The WB coil 107 is thereby disposed in a proper position. The couch rail 11 is installed inside the coil supporting unit 30 with, for example, the support members 10a and 10b. The gantry is covered with a gantry cover 12 except for a surface covered with the couch rail 11.

In the case of using the coil supporting unit 20 (FIG. 2), because the WB coil 107 is supported by the coil supporting unit 20 having a minimum necessary size, the comfortableness for the subject is increased. However, this case requires more components in comparison with the case of using the coil supporting unit 30 (FIG. 3), and increases the manufacturing cost.

By contrast, in the case of using the coil supporting unit 30 (FIG. 3), the coil supporting unit can be achieved with a simpler structure, because the coil supporting unit 30 is supported from the static magnetic field magnet 101 without requiring other support members. However, the above case reduces the comfortableness for the subject, because the coil supporting unit 30 has the same internal diameter as that of the part in which the WB coil 107 is disposed over the whole axial length of the coil supporting unit 30.

Thus, the MRI apparatus 100 according to the first embodiment includes a coil supporting unit 40 that has a substantially cylindrical shape and supports the WB coil 107, to improve the comfortableness for the subject with a simple structure. The substantially cylindrical shape described herein includes not only a regular cylindrical shape, but also a cylindrical shape that is warped within a range not seriously impairing the function of the MRI apparatus 100. Specifically, examples of the substantially cylindrical shape include the cases where the xy plane has a perfect circle or oval cross section.

Characteristics of External Appearance of Coil Supporting Unit 40

Figure 4:
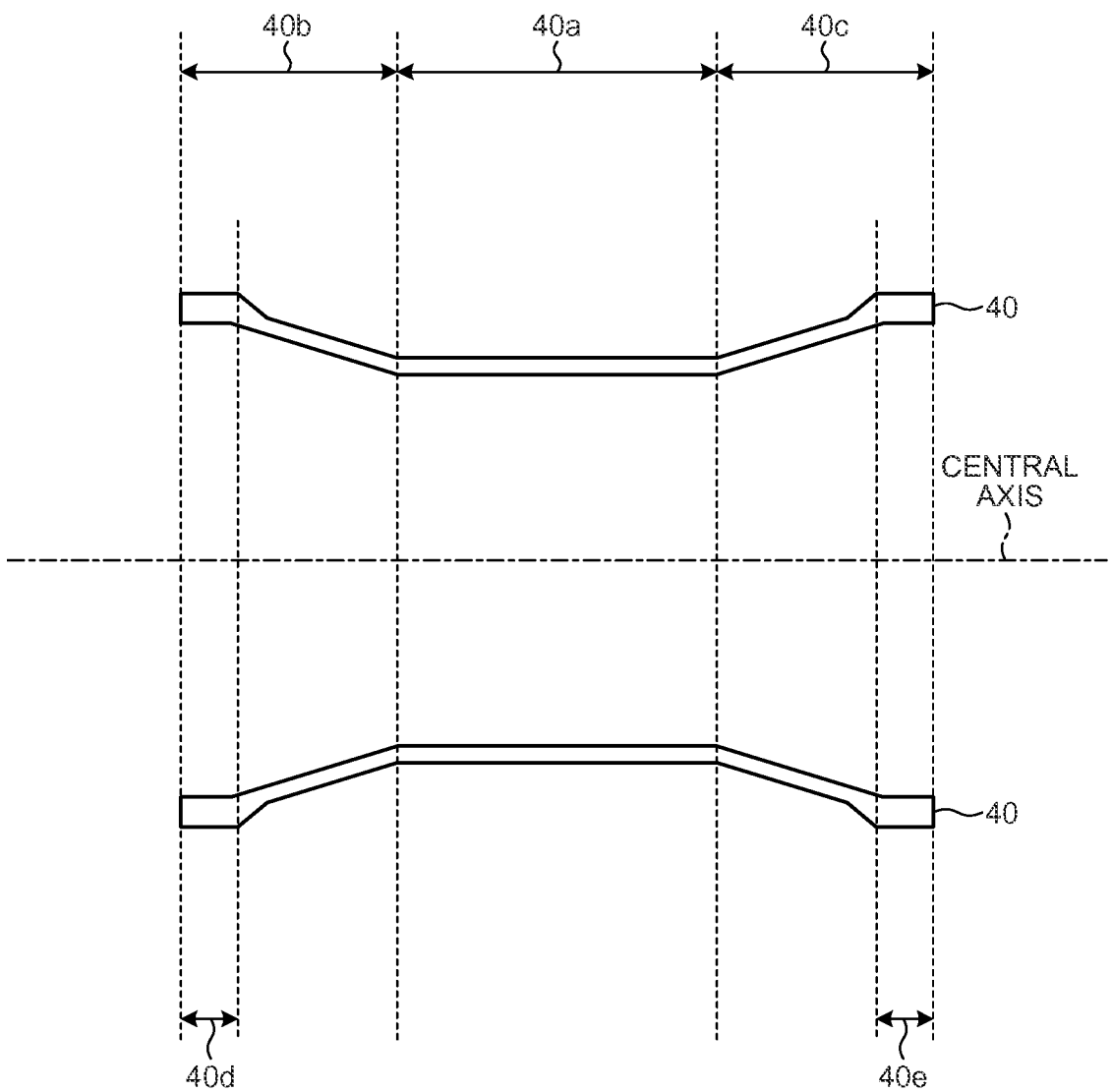
FIG. 4 is a diagram illustrating an example of the coil supporting unit according to the first embodiment.
Figure 5:
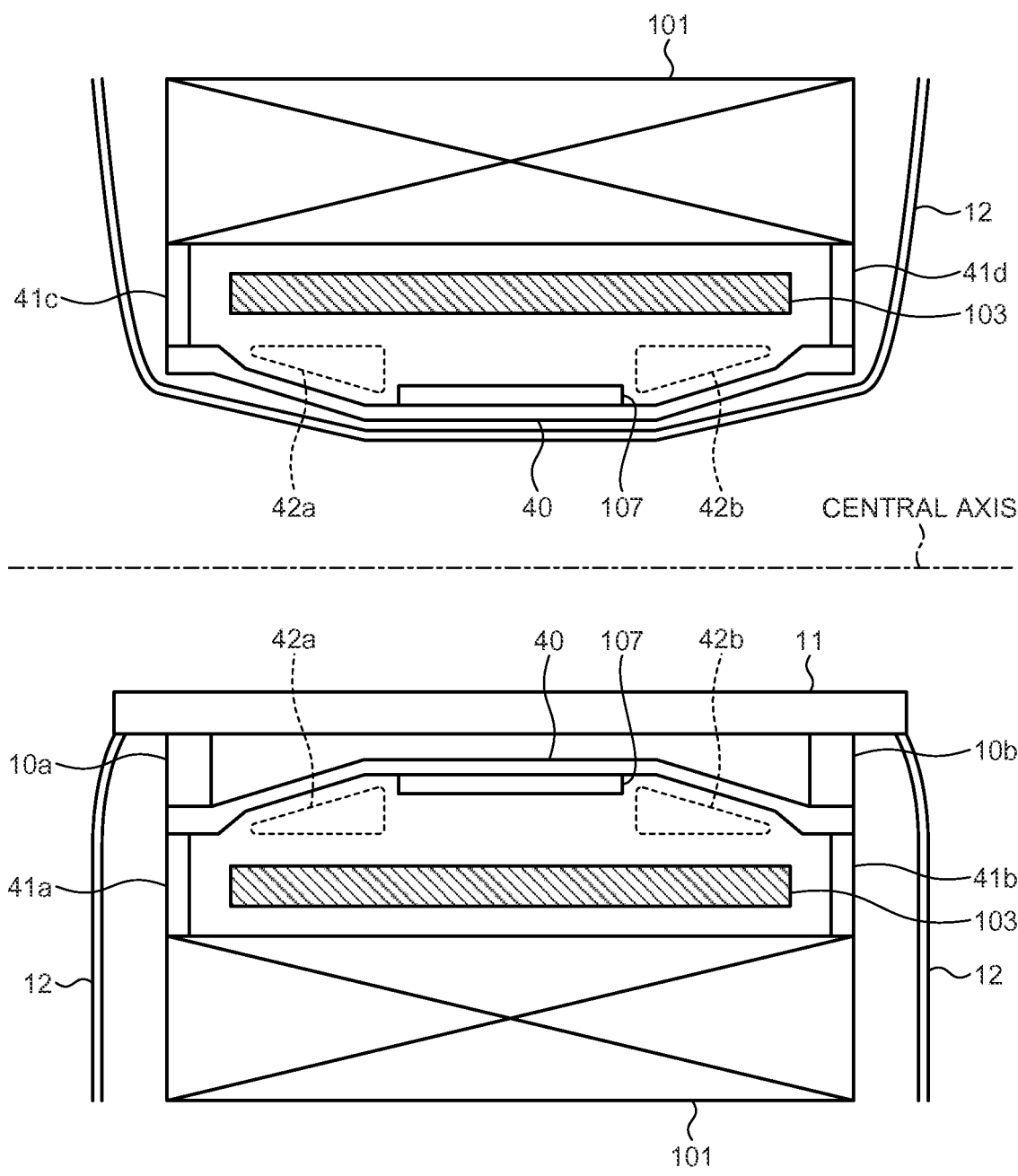
FIG. 5 is a diagram illustrating the example of the coil supporting unit according to the first embodiment.
Figure 6:
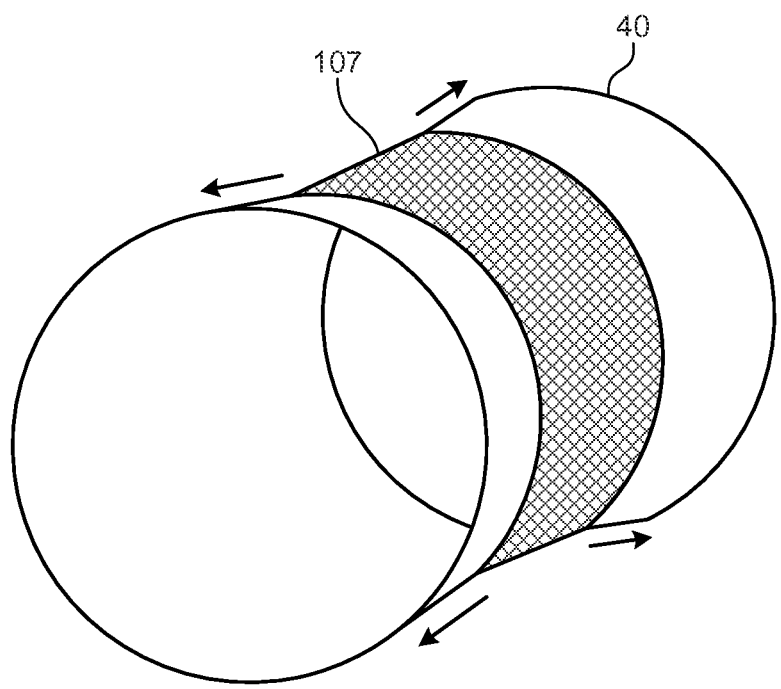
FIG. 6 is a diagram illustrating the example of the coil supporting unit according to the first embodiment.

Characteristics of the external appearance of the coil supporting unit 40 will be explained with reference to FIG. 4 to FIG. 6. FIG. 4 to FIG. 6 are diagrams illustrating an example of the coil supporting unit 40 according to the first embodiment. FIG. 4 is a cross-sectional view (a cross section in a yz plane extending along the central axis) of the coil supporting unit 40. FIG. 5 is a cross-sectional view (a cross section in a yz plane extending along the central axis) of the gantry. FIG. 6 is a perspective view illustrating a positional relation between the coil supporting unit 40 and the WB coil 107. Each of the drawings will be briefly explained hereinafter, and then characteristics of the external appearance of the coil supporting unit 40 will be explained in detail.

As illustrated in FIG. 4, the coil supporting unit 40 mainly includes three ranges 40a, 40b, and 40c. The range 40a is a certain range including the center of the magnetic field and having a substantially cylindrical shape that is parallel with the axial direction. The ranges 40b and 40c are formed between respective ends of the coil supporting unit 40 and the range 40a and each have a substantially cylindrical shape that is not parallel with the axial direction. Specifically, each of the ranges 40b and 40c is formed in a substantially cylindrical shape that is inclined to spread from the center of the magnetic field toward the corresponding end. Ranges 40d and 40e are ranges extending from the respective ends of the coil supporting unit 40 toward the axial center for a certain distance.

Although in the first embodiment the coil supporting unit 40 is explained for each of the respective ranges 40a, 40b, 40c, 40d, and 40e for convenience of explanation, it is merely means for explaining characteristics of the external appearance of the coil supporting unit 40. Thus, it does not mean that the coil supporting unit 40 should be separately molded as the ranges 40a, 40b, 40c, 40d, and 40e. The method for molding the coil supporting unit 40 will be explained later.

As illustrated in FIG. 5, the WB coil 107 is placed in the range 40a of the coil supporting unit 40. In addition, the coil supporting unit 40 is supported by, for example, a plurality of support members 41a, 41b, 41c, and 41d. The support members 41a, 41b, 41c, and 41d are, for example, bases that support a certain range of the external circumferential surface of the coil supporting unit 40. The WB coil 107 is thereby disposed in a proper position. The couch rail 11 is installed inside the coil supporting unit 40 with, for example, the support members 10a and 10b. The gantry is covered with the gantry cover 12 except for the surface covered with the couch rail 11. In addition, the gradient coil 103 is supported from the static magnetic field magnet with a support member that is not illustrated.

FIG. 5 merely illustrates an example. For example, the support members 41a, 41b, 41c, and 41d may not be necessarily four support members. For example, the MRI apparatus 100 may not include the support members 41c and 41d.

As illustrated in FIG. 6, the coil supporting unit 40 has a cylindrical shape having a perfect-circle cross section in the xy plane. Specifically, end surfaces thereof and the cross section in the xy plane in the range 40a have a perfect-circle shape. In addition, the WB coil 107 is disposed on an external circumferential surface of the range 40a in the coil supporting unit 40. Specifically, a coil pattern of the WB coil 107 is formed on the external circumferential surface of the range 40a in the coil supporting unit 40, and a condenser or a capacitor are arranged thereon. As an example, the range 40a of the coil supporting unit 40 serves as a minimum range in which a coil pattern of the WB coil 107 can be formed.

FIG. 6 merely illustrates an example. For example, as described above, the coil supporting unit 40 may have a cylindrical shape having an oval cross section in the xy plane. In this case, only one of the shape of the end surfaces and the shape of the cross section in the xy plane in the range 40a may be oval, or both of them may be oval. Specifically, the shape of the end surfaces may be different from the shape of the cross section in the xy plane in the range 40a.

The characteristics of the external appearance of the coil supporting unit 40 will be explained in detail hereinafter. In the coil supporting unit 40, the range 40a including an installing surface on which the WB coil 107 is installed is formed in parallel with the axial direction. The internal diameter of the range 40a is determined such that the WB coil 107 is disposed in a proper position. The axial length of the range 40a is greater than the axial length of the WB coil 107, and smaller than the axial length of the gradient coil 103. Each of the ranges 40b and 40c has gradient to spread from the center of the axial direction toward the corresponding end (arrows in FIG. 6). In other words, both ends of the coil supporting unit 40 have internal diameters (internal circumferences) that are greater than the internal diameter (internal circumference) of the range 40a. The coil supporting unit 40 having the structure enhances the comfortableness for the subject.

Although the internal diameter is not unique when the coil supporting unit 40 has a cylindrical shape having an oval cross section in the xy plane, at least each end of the coil supporting unit 40 has an internal circumference greater than the internal circumference of the range 40a.

The axial length of the coil supporting unit 40 is greater than the axial length of the gradient coil 103. The external circumferential surfaces of the ranges 40d and 40e of the coil supporting unit 40 are formed in parallel with the internal circumferential surface of the static magnetic field magnet 101. Consequently, the coil supporting unit 40 can be supported by the support members 41a, 41b, 41c, and 41d having a simple structure. This structure enables the coil supporting unit 40 to support the WB coil 107 with a simple structure without any increase in the number of components. The axial length of each of the ranges 40d and 40e is smaller than the length of each of parts of the static magnetic field magnet 101, by which the static magnetic field magnet 101 is longer than the gradient coil 103 beyond the end surfaces of the gradient coil 103.

Each of the ranges 40d and 40e of the coil supporting unit 40 has a thickness greater than the thickness of the range 40a. The range 40a is preferably formed to have a small thickness within a range that enables the coil supporting unit 40 to support the WB coil 107, to enhance the comfortableness for the subject. By contrast, the ranges 40d and 40e of the coil supporting unit 40 are preferably formed to have a large thickness to prevent the coil supporting unit 40 from being deformed by a load applied onto the positions of the ranges 40d and 40e. Specifically, load of the couch rail 11, the couchtop 105a, and the subject is applied onto the ranges 40d and 40e. In addition, when the positions of the support members 41a, 41b, 41c, and 41d that support the coil supporting unit 40 are shifted from the positions of the support members 10a and 10b that support the couch rail 11 from the coil supporting unit 40, force caused by moment is also applied onto the coil supporting unit 40. For this reason, the ranges 40d and 40e are preferably formed with a larger thickness.

In addition, using the coil supporting unit 40 generates spaces 42a and 42b. The space 42a is, for example, a space between the external circumferential surface of the range 40b and the internal circumferential surface of the gradient coil 103. The space 42b is, for example, a space between the external circumferential surface of the range 40c and the internal circumferential surface of the gradient coil 103. Because the number of components of the coil supporting unit 40 is only one, the spaces 42a and 42b generated in the case of using the coil supporting unit 40 are broader than, for example, the spaces 23a and 23b in the case of using the coil supporting unit 20 having a larger number of components. In this manner, the coil supporting unit 40 secures broad spaces in which a sound insulating material or a sound absorbing material can be disposed.

The above example is merely an example. For example, although the example of FIG. 5 is explained with the structure in which a space exists between the gantry cover 12 and the coil supporting unit 40 inside the bore, the embodiment is not limited to it. For example, the gantry cover 12 may be brought into close contact with the internal circumferential surface of the coil supporting unit 40 to remove the space. As another example, the gantry cover and the coil supporting unit 40 may be arranged in parallel, or not in parallel. However, to enhance the comfortableness for the subject, the space between the gantry cover 12 and the coil supporting unit 40 is preferably small, and the gantry cover 12 is preferably formed along the internal circumferential surface of the coil supporting unit 40.

In addition, for example, although the example in FIG. 5 and FIG. 6 is explained with the case where the axial length of the range 40a has a minimum range in which the coil pattern of the WB coil 107 can be formed and the axial length of the range 40a is equal to or greater than the axial length of the WB coil 107, the embodiment is not limited to it. For example, the axial length of the range 40a may be smaller than the axial length of the WB coil 107. In other words, the WB coil 107 may be formed to extend over the ranges 40a, 40b, and 40c, or may be separately formed in each of the ranges 40a, 40b, and 40c. However, the axial length of the range 40a is preferably equal to or greater than the axial length of the WB coil 107, from the viewpoint of securing a necessary sensitivity region while enhancing the comfortableness for the subject.

Figure 7:
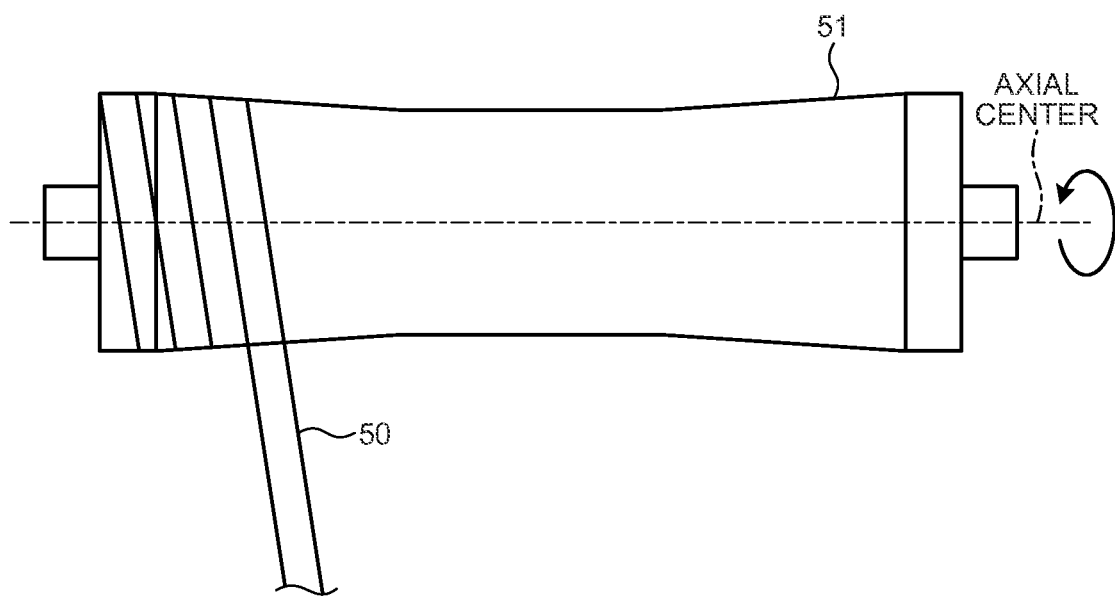
FIG. 7 is a diagram illustrating an example of a method for manufacturing the coil supporting unit according to the first embodiment.
Figure 8:
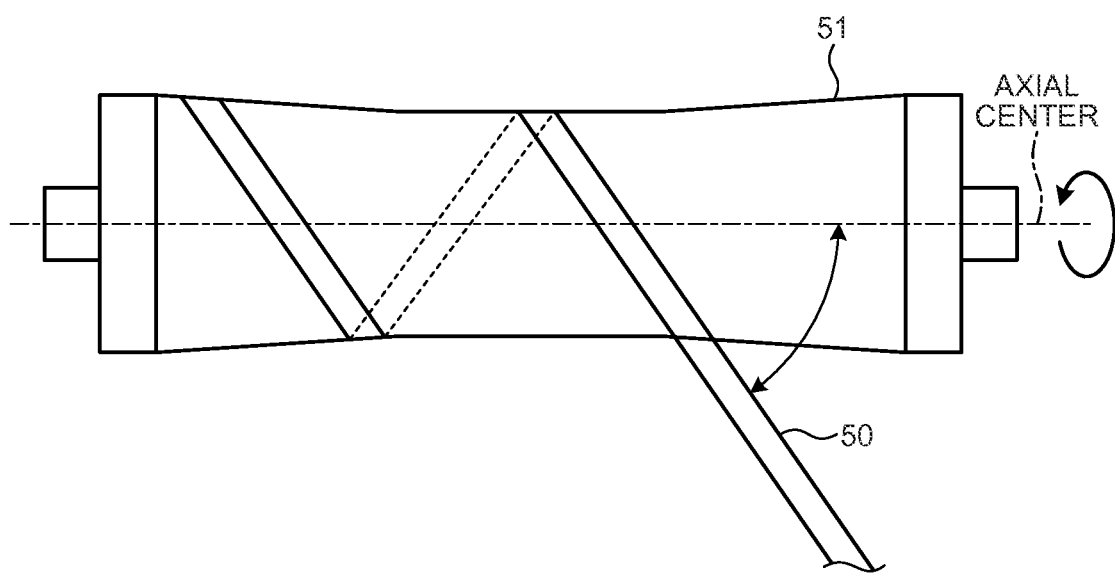
FIG. 8 is a diagram illustrating an example of a method for manufacturing the coil supporting unit according to the first embodiment.

Characteristics of Coil Supporting Unit 40 According to Method for Manufacturing the Same Examples of a method for manufacturing the coil supporting unit 40 will be explained hereinafter with reference to FIG. 7 and FIG. 8. FIG. 7 and FIG. 8 are diagrams illustrating examples of a method for manufacturing the coil supporting unit 40 according to the first embodiment.

As illustrated in FIG. 7 and FIG. 8, the coil supporting unit 40 according to the first embodiment is formed (molded) by, for example, filament winding (FW). Specifically, in filament winding, a fiber bundle (roving) 50 is impregnated with a resin (thermosetting resin) serving as an adhesive, regularly wound around a rotating mandrel (mold) 51 with the thread end traversed while provided with a certain tension, and heated and cured after it is wound to have a predetermined thickness. Next, after the external shape thereof is molded with a lathe, the mandrel 51 is extracted, whereby the coil supporting unit 40 is obtained.

The fiber bundle 50 is a bundle in which a plurality of fibers are arranged in a certain direction. Specifically, because a bundle in which a plurality of fibers are arranged in a certain direction is wound, the coil supporting unit 40 has a structure in which a plurality of fibers are arranged in a certain direction. The fibers that are wound at least have a length equal to a round of the internal circumference of the range 40a. For example, the fibers are glass fibers. The resin is, for example, a polyester resin or an epoxy resin.

Hoop winding (FIG. 7) or helical winding (FIG. 8) is adopted as the FW pattern. Hoop winding is a method of winding the fiber bundle 50 around the mandrel 51 in a direction of about 90° to the axial center direction. The fiber bundle 50 is thereby wound around the mandrel 51 without a large space therebetween. The layer of the fiber bundle 50 wound by hoop winding is referred to as a hoop winding layer. Helical winding is a method of winding the fiber bundle 50 around the mandrel 51 at a certain diagonally crossing angle to the axial center direction. This method increases the number of parts of the fiber bundle 50 that cross each other, and increases the strength of the molded article (coil supporting unit 40). The layer of the fiber bundle 50 wound by helical winding is referred to as a helical winding layer.

For example, hoop winding and helical winding are adopted in a proper combination for the coil supporting unit 40. Specifically, the coil supporting unit 40 includes a hoop winding layer and a helical winding layer. In this manner, the coil supporting unit 40 is adjusted to have a proper strength.

In addition, for example, the coil supporting unit 40 has a hoop winding layer at the first layer from the internal circumferential surface thereof. Specifically, in filament winding, first, the fiber bundle 50 is wound around the mandrel 51 by hoop winding. The coil supporting unit 40 thereby enables formation of the bore for the subject with a uniform layer.

The examples illustrated in FIG. 7 and FIG. 8 are mere examples. For example, the coil supporting unit 40 may not necessarily have a hoop winding layer at the first layer from the internal circumferential surface. For example, the coil supporting unit 40 may be formed of the FW pattern of only one of hoop winding and helical winding.

As described above, the MRI apparatus 100 according to the first embodiment includes the coil supporting unit 40 that is formed in a substantially cylindrical shape and supports the WB coil 107. The coil supporting unit 40 includes the range 40a that includes an installing surface on which the WB coil 107 is installed and formed in parallel with the axial direction, and each of both ends of the coil supporting unit 40 has an internal circumference greater than the internal circumference of the range 40a. Thus, the MRI apparatus 100 enables enhancement of the comfortableness for the subject with a simple structure. For example, the MRI apparatus 100 contributes to suppression of the manufacturing cost, because the MRI apparatus 100 does not increase the number of components.

Modification of the First Embodiment

The shape of the coil supporting unit 40 is not limited to the shape explained in FIG. 4 to FIG. 6. For example, the coil supporting unit 40 may be formed to include the ranges 40b and 40c having a larger thickness.

Figure 9:
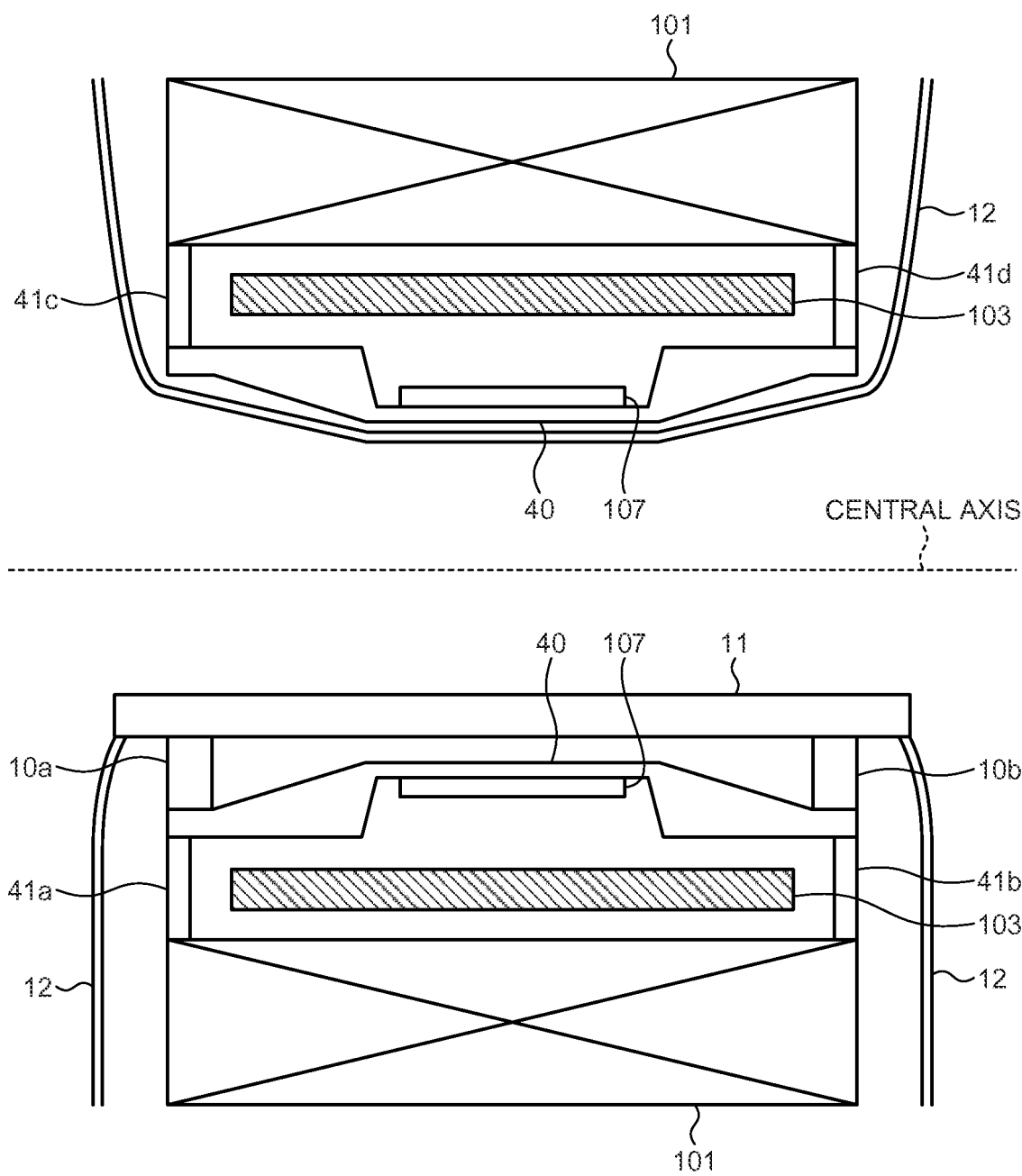
FIG. 9 is a diagram illustrating a modification of the coil supporting unit according to the first embodiment.

FIG. 9 is a diagram illustrating a modification of the coil supporting unit 40 according to the first embodiment. FIG. 9 is a cross-sectional view (cross section in the yz plane extending along the central axis) of the gantry. As illustrated in FIG. 9, the coil supporting unit 40 can be formed to include the ranges 40b and 40c having a thickness greater than the thickness explained in FIG. 4 to FIG. 6. Specifically, the coil supporting unit 40 is molded to fill the positions corresponding to the spaces 42a and 42b illustrated in FIG. 5. This structure increases the thickness of the coil supporting unit 40, and thus increases the sound insulating property of the coil supporting unit 40. In this case, the comfortableness for the subject is not reduced, because the internal circumferential surface of the coil supporting unit 40 is the same as the internal circumferential surface of the coil supporting unit 40 illustrated in FIG. 4 to FIG. 6.

Specifically, the coil supporting unit 40 is formed to include parts extending between the respective end surfaces and a certain range and having an inclined, substantially cylindrical shape or a curved, substantially cylindrical shape, and external circumferential surfaces of the parts having the substantially cylindrical shape (that is, external circumferential surfaces of the ranges 40b and 40c) are parallel with the internal circumferential surface of the static magnetic field magnet. As a result, the parts have an increased thickness, and thus the sound insulating property of the coil supporting unit 40 is increased. The external circumferential surfaces of the ranges 40b and 40c may not be necessarily parallel with the internal circumferential surface of the static magnetic field magnet, but may be slightly inclined or uneven within a range not obstructing arrangement thereof with the gradient coil 103.

Although the above embodiment illustrates the case where the range 40b and the range 40c are formed symmetrically, the embodiment is not limited to it. For example, the range 40b and the range 40c may have different shapes, within a range not seriously impairing the function of the MRI apparatus 100. For example, the range 40b and the range 40c may have shapes such that one on the side in which the subject is inserted has a larger shape.

In addition, although the above embodiment illustrates the case where each of the ranges 40b and 40c is formed to have an inclined, substantially cylindrical shape, the embodiment is not limited to it. For example, each of the ranges 40b and 40c may have a curved, substantially cylindrical shape to spread to describe an arc from the magnetic field center toward the corresponding end. Each of the ranges 40b and 40c may not only be inclined or curved but also, for example, uneven.

As illustrated in FIG. 4, the coil supporting unit 40 mainly includes the three ranges 40a, 40b, and 40c. The range 40a includes an installing surface on which the WB coil 107 is installed, and formed to have a substantially cylindrical shape parallel with the axial direction. In addition, the ranges 40b and 40c are formed to have a substantially cylindrical shape that is not parallel with the axial direction between the respective ends of the coil supporting unit 40 and the range 40a. Specifically, the ranges 40b and 40c are formed to have an inclined, substantially cylindrical shape to spread from the center of the axial direction toward the respective ends. Each of the ranges 40d and 40e is a range extending from the corresponding end of the coil supporting unit 40 toward the center direction of the axial direction for a certain distance.

At least one embodiment explained above can increase the comfortableness for the subject with a simple structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
    an MRI gantry including a magnet and gradient magnetic coils disposed about a high-frequency coil and an imaging volume there-within;
    said high-frequency coil having a coil pattern with an axial length that is shorter than an axial length of said gradient magnetic coils; and
    a coil supporting unit that supports the high-frequency coil with said high-frequency coil being isolated from said gradient magnetic coils, said coil supporting unit having an axial length that is longer than the axial length of said gradient magnetic coils, with said coil supporting unit having a substantially cylindrical shape which tapers radially outward into a larger internal circumference toward at least one axial end thereof; and
    the coil supporting unit also being supported by the magnet only at locations that are spaced axially beyond the axial ends of said gradient magnetic coils and having sound insulating material and/or sound absorbing material disposed at only a location between the gradient magnetic coils and tapered portion of the coil supporting unit among locations between the gradient magnetic coils and the coil supporting unit, the location being located right above the tapered portion.

2. The magnetic resonance imaging apparatus according to claim 1, wherein each of both ends of the coil supporting unit has a thickness that is greater than a thickness of a middle portion thereof.

3. The magnetic resonance imaging apparatus according to claim 1, wherein external circumferential surfaces extending from respective ends of the coil supporting unit toward a central direction in an axial direction within a certain distance are parallel with an internal circumferential surface of the magnet.

4. The magnetic resonance imaging apparatus according to claim 1, wherein the coil supporting unit includes parts extending from respective end surfaces toward a central portion thereof, each of the parts having substantially cylindrical shape parallel with an internal circumferential surface of the magnet.

5. The magnetic resonance imaging apparatus according to claim 1, wherein the coil supporting unit has a substantially cylindrical shape having a perfect-circle cross section or an oval cross section in an xy plane.

6. The magnetic resonance imaging apparatus according to claim 1, wherein the coil supporting unit is formed of a plurality of fibers and a resin, and has a structure in which the fibers are arranged in a certain direction.

7. The magnetic resonance imaging apparatus according to claim 6, wherein the fibers at least have a length equal to a round of the internal circumference of a central portion of the coil supporting unit.

8. The magnetic resonance imaging apparatus according to claim 6, wherein the coil supporting unit includes a hoop winding layer and a helical winding layer.

9. The magnetic resonance imaging apparatus according to claim 8, wherein the coil supporting unit includes the hoop winding layer at a first layer from an internal circumferential surface thereof.

10. The magnetic resonance imaging apparatus according to claim 6, wherein the fibers are formed of glass fibers, and the resin is formed of a polyester resin or an epoxy resin.

11. A magnetic resonance imaging (MRI) apparatus comprising:
- an MRI gantry including a magnet and gradient magnetic coils disposed about a high-frequency coil and an imaging volume there-within;
- said high-frequency coil having a coil pattern with an axial length that is shorter than an axial length of said gradient magnetic coils; and
- a coil supporting unit that supports the high-frequency coil with said high-frequency coil being isolated from said gradient magnetic coils, said coil supporting unit having an axial length that is longer than the axial length of said gradient magnetic coils and cylindrical shape which tapers radially outward into a larger internal circumference toward at least one axial end thereof;
- the coil supporting unit being molded by filament winding, and
- the coil supporting unit being supported by the magnet only at locations spaced axially beyond axial ends of said gradient magnetic coils and having a sound insulating material and/or a sound absorbing material disposed at only a location between the gradient magnetic coils and a tapered portion of the coil supporting unit among locations between the gradient magnetic coils and the coil supporting unit, the location being located right above the tapered portion.

* * * * *